(12) United States Patent
Yamagishi et al.

(10) Patent No.: US 8,881,907 B2
(45) Date of Patent: Nov. 11, 2014

(54) SUBSTRATE STORAGE CONTAINER WITH GRAVITY CENTER ADJUSTMENT MEMBER

(75) Inventors: Hiroki Yamagishi, Saitama (JP); Toshiyuki Kamada, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 13/641,707

(22) PCT Filed: Apr. 8, 2011

(86) PCT No.: PCT/JP2011/058920
§ 371 (c)(1),
(2), (4) Date: Oct. 17, 2012

(87) PCT Pub. No.: WO2011/132553
PCT Pub. Date: Oct. 27, 2011

(65) Prior Publication Data
US 2013/0032509 A1    Feb. 7, 2013

(30) Foreign Application Priority Data

Apr. 22, 2010   (JP) .................................. 2010-098452

(51) Int. Cl.
*B65D 85/30*    (2006.01)
*H01L 21/673*    (2006.01)

(52) U.S. Cl.
CPC .... *H01L 21/67379* (2013.01); *H01L 21/67303* (2013.01); *B65D 2585/86* (2013.01); *H01L 21/67386* (2013.01)
USPC .......................................... 206/711; 206/454

(58) Field of Classification Search
USPC ........ 206/454, 710, 711; 211/41.18; 414/217, 414/217.1
See application file for complete search history.

(56) References Cited

U.S. PATENT DOCUMENTS

| 5,248,033 | A | * | 9/1993 | Kos et al. ....................... 206/711 |
| 6,382,419 | B1 | * | 5/2002 | Fujimori et al. ............... 206/454 |
| 6,691,876 | B2 | * | 2/2004 | Tsai et al. ................... 211/41.18 |
| 7,344,031 | B2 | * | 3/2008 | Hasegawa et al. ............ 206/710 |
| 7,669,717 | B2 | * | 3/2010 | Sumi .............................. 206/710 |
| 7,789,240 | B2 | * | 9/2010 | Yamagishi et al. ........... 206/710 |

FOREIGN PATENT DOCUMENTS

| JP | 2000-306988 A | 11/2000 |
| JP | 2002-261159 A | 9/2002 |
| JP | 2008-108765 A | 5/2008 |
| JP | 2009-259951 A | 11/2009 |
| WO | 02/093622 A2 | 11/2002 |

OTHER PUBLICATIONS

International Search Report w/translation issued in PCT/JP2011/058920 mailed May 31, 2011 (5 pages).
Extended European Search Report for European Application No. 11771888.2, dated May 8, 2014 (6 pages).

\* cited by examiner

*Primary Examiner* — Bryon Gehman
(74) *Attorney, Agent, or Firm* — Osha Liang LLP (57) ABSTRACT

A substrate storage container is provided with a container body for aligning and storing a plurality of sheets of semiconductor wafers, and a lid for detachably opening/closing an open front of the container body, in which a robotic flange for conveyance is attached on a substantially center portion of a ceiling of the container body, in which heavy gravity center position adjustment member is provided at a rear portion of the container body such as on a rear wall, a side wall rear portion so that inclination of the substrate container body toward the lid side is regulated with the gravity center position adjustment member.

6 Claims, 10 Drawing Sheets

SUBSTRATE STORAGE CONTAINER WITH GRAVITY CENTER ADJUSTMENT MEMBER

FIELD OF THE INVENTION

The present invention relates to a substrate storage container which is used for storing, housing, conveying, transporting, etc. of a substrate represented by a semiconductor wafer.

BACKGROUND ART

A conventional substrate storage container, though not shown, includes a container body for aligning and storing a plurality of sheets of semiconductor wafers vertically and a heavy lid for opening/closing an open front of the container body, and is automatically conveyed between processes as well as positioned to be loaded on a load port device attached to a processing apparatus for semiconductor wafers (see Patent Literature 1).

The container body is formed into a front open box whose front is opened for storing a semiconductor wafer of, for example, φ 300 mm or 450 mm horizontally, in which on a substantially center portion of a ceiling, a robotic flange for conveyance which is gripped to be suspended by a ceiling conveyance mechanism of a plant is attached. Further, the lid is embedded with a locking mechanism which is operated from outside by a lid opening and closing device of the load port device, and a front retainer for resiliently holding front periphery of the plurality of sheets of wafers is attached on an opposed surface opposed to the semiconductor wafer stored in the container body, thus increasing mass of the container due to these locking mechanism and front retainer.

PRIOR ART LITERATURES

Patent Literature

Patent Literature 1: Japanese Patent Application Laid-open No. 2000-306988

SUMMARY OF THE INVENTION

Since the conventional substrate storage container is configured as described above and the heavy lid is fit to the open front of the container body storing a semiconductor wafer, the center of gravity is largely biased to a front side from a center position of the semiconductor wafer, namely, a front lid side, and therefore, there are not a few cases where the container is inclined toward the lid side in the case of being held up and conveyed by the ceiling conveyance mechanism. As a result, there occurs a problem that in conveyance by the ceiling conveyance mechanism, it becomes very difficult that the substrate storage container is conveyed at high speed while keeping a stable posture, or positioned and loaded to the load port device of the processing apparatus.

In one or more embodiments of the claimed invention, a method has been proposed for realizing reduction of the weight by forming the lid thinner. However, in the case of the method, a reactive force at the time of holding the semiconductor wafer by the front retainer acts on the lid, thus newly causing a possibility to lead to deformation or damage due to shortage of rigidity of the lid.

One or more embodiments of the claimed invention have been devised in view of the above, and provide a substrate storage container in which the center of gravity is suppressed to be biased to the lid side so that inclination toward the lid side is prevented, and conveyance and the like in a stable posture is able to be performed.

One or more embodiments of the claimed invention provide a container body for storing a substrate and a lid for opening/closing an open front of the container body, in which the container body is provided with a suspended portion for conveyance, characterized in that a gravity center position adjustment member is provided at a rear portion of the container body so as to regulate inclination thereof toward a lid side by the gravity center position adjustment member.

Note that, it is possible that a robotic flange gripped by a conveyance mechanism is attached on a ceiling of the container body to serve as the suspended portion, and on the lid, a retainer for holding periphery of the substrate is mounted while a locking mechanism is attached.

Further, it is possible that the gravity center position adjustment member is a hollow capsule mounted on a rear wall of the container body in which an impact alleviating material is filled so as to be movable.

Furthermore, it is possible that on rear wall both side portions of the container body, recessed portions are respectively formed, on an inner surface of each recessed portion, an interference rib is formed, the capsule is formed into a hollow substantially columnar shape so as to be able to be fitted to each of the plurality of recessed portions on the container body, and on an outer circumferential surface of the capsule, an interference groove to which the interference rib of the recessed portion is fitted is formed.

Further, it is possible to mount a stopper band on the rear wall of the container body for preventing coming off of the capsule by making an elastic holding piece to interfere therewith.

In addition, it is also possible that the retainers capable of holding the periphery of the substrate are formed on rear wall inner surface both side portions of the container body by being opposed to the recessed portions.

Furthermore, it is possible that the gravity center position adjustment member is a reinforcement rib that is formed on a side wall rear portion of the container body.

Furthermore, it is possible that the gravity center position adjustment member is a counterweight that is attached on a bottom portion on a rear wall side of the container body.

Additionally, it is also possible that the gravity center position adjustment member is a plurality of supporting blocks mounted on the rear wall of the container body, and when the container body is arranged so that the front faces upward with the plurality of supporting blocks, inclination of the container body is prevented.

Furthermore, it is possible to expect that the gravity center position adjustment member is a supporting plate attached to the rear wall of the container body, and a non-contact surface which is not in contact over the rear wall of the container body is formed to be inclined, and when the container body is arranged so that the front faces upward with the supporting plate, the container body is inclined toward one direction.

Here, the substrate in claims includes one or more of a semiconductor wafer, a circuit substrate, a glass substrate, a mask substrate and the like of at least φ 300 mm or 450 mm. Moreover, the container body and the capsule may be made of any of transparent, opaque and semi-transparent. It is possible that the rear wall of the container body is configured to be in an uneven reinforced structure, and a part of which is formed to be a recessed portion extending vertically, and the recessed portion is formed into a groove in a substantially semicircular shape in section.

The bottom portion of the rear wall side of the container body includes at least a rear wall bottom portion of the container body, a rear portion of a bottom plate attached to a base plate of the container body, and a portion between the base plate of the container body and the rear portion of the bottom plate. A shape, the number and the like of an interference rib or an interference groove may be changed to be increased or decreased as appropriate. Furthermore, it is not especially limited whether the reinforcement rib or the counterweight is detachable or not, or one or more of which are provided.

According to one or more embodiments of the claimed invention, the gravity center position adjustment member is provided at the rear portion of the container body to function as a counterweight, thus making it possible to suppress movement of the center of gravity of the substrate storage container storing a substrate within a predetermined acceptable range from a center position of the substrate. This suppressive action enables to prevent the center of gravity of the substrate storage container storing a substrate from being biased to the lid side and to suppress inclination of the substrate storage container toward the lid side, and the posture of the substrate storage container is able to be stabilized.

According to one or more embodiments of the claimed invention, there is an effect that the center of gravity is suppressed to be biased to the lid side so as to prevent the substrate storage container from inclining toward the lid side, and conveyance in a stable posture, and the like is able to be performed.

Further, in a case where the gravity center position adjustment member is a hollow capsule attached to a rear wall of the container body in which an impact alleviating material is filled so as to be movable, even when an impact, etc. acts on the substrate storage container, it thus possible to absorb or damp the impact, etc. due to movement of the impact alleviating material along with behavior of the substrate storage container.

In addition, in a case where on rear wall both side portions of the container body, recessed portions are respectively formed, and on an inner surface of each recessed portion, an interference rib is formed, the capsule is formed into a hollow substantially columnar shape so as to be able to be fitted to each of the plurality of recessed portions on the container body, and on an outer circumferential surface of the capsule, an interference groove to which the interference rib of the recessed portion is fitted is formed, it is thus possible to improve balance of the substrate storage container by positioning the capsules on both side portions on the rear wall approximately uniformly, and to hinder displacement, rotation of the substrate, or the like along with deterioration of the balance. Moreover, it is possible to prevent the capsule from coming off by a simplified configuration, by the interference rib and the interference groove fitted to each other.

Additionally, according to the above embodiments of the claimed invention, since it is possible that a plurality of supporting blocks have same heights, when the container body storing substrates is arranged so that the front of the container body faces upward, it is possible to stabilize the posture of the container body and to prevent the substrates in the container body from inclining to be in contact with each other so that breakage or the like may occur. Furthermore, since there is no need to provide the recessed portion on the container body, there is no necessity to make an improvement in a mold when molding a container.

Additionally, according to the above embodiments of the claimed invention, the container body storing a plurality of sheets of substrates is arranged so that the front of the container body faces upward, and even when the lid is removed from the front of the container body, the stored plurality of substrates are able to be inclined toward one direction so as to be aligned and supported. Accordingly, it is possible to prevent the plurality of sheets of substrates from being in contact with each other, and the adjacent substrates from inclining toward opposite directions to be in contact with each other so that damage and breakage along therewith may be caused. Furthermore, since there is no need to provide the recessed portion on the container body, there is no necessity to make an improvement in a mold when molding a container.

DETAILED DESCRIPTION

Hereinafter, embodiments of the present invention are described with reference to the drawings. A substrate storage container in accordance with one or more embodiments of the present embodiment includes, as shown in FIG. 1 to FIG. 7, a container body 1 which aligns and stores semiconductor wafers W and a heavy lid 20 which detachably opens/closes an open front 13 of the container. At a rear portion of the container body 1, heavy gravity center position adjustment member 40 is provided, and the gravity center position adjustment member 40 prevents the center of gravity from being biased to a front lid 20 side, or regulates inclination toward the lid 20 side.

Figure 1:
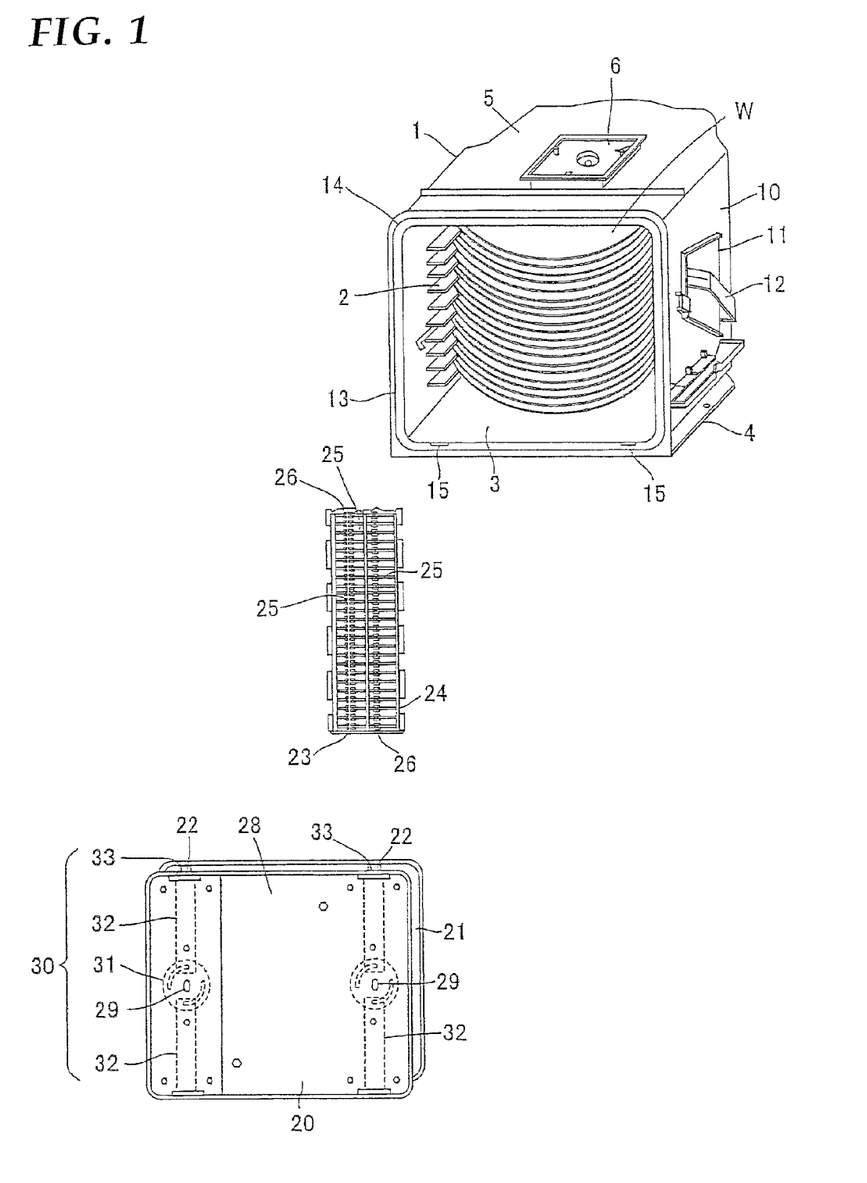
FIG. 1 is an overall illustrative perspective view schematically showing an embodiment of a substrate storage container according to the present invention.

As shown in FIG. 1, the semiconductor wafer W is composed of a silicon wafer of φ 300 mm with a thickness of 775 μm, or of φ 450 mm with a thickness of 925 μm, and on a peripheral portion thereof, a not-shown notch for positioning or identification is cut out in a V-shape in plan view, and 25 sheets of wafers are aligned and stored vertically in the container body 1.

The container body 1 and the lid 20 have a plurality of parts each of which is injection molded with a molding material containing a predetermined resin, and are composed of a combination of the plurality of such parts. The predetermined resin in the molding material includes, for example, polycarbonate, polyether ether ketone, polyether imide, polybutylene terephthalate, or thermoplastic elastomer composed of polyester-based, polystyrene-based or polyolefin-based one etc., polyacetal, liquid crystal polymer, a cyclic olefin resin and the like, which are excellent in a mechanical property, heat resistance and the like. To the predetermined resin, carbon, carbon fibers, metal fibers, carbon nanotubes, conductive polymers, antistatic agents, fire retardant or the like is selectively added as necessary.

Figure 2:
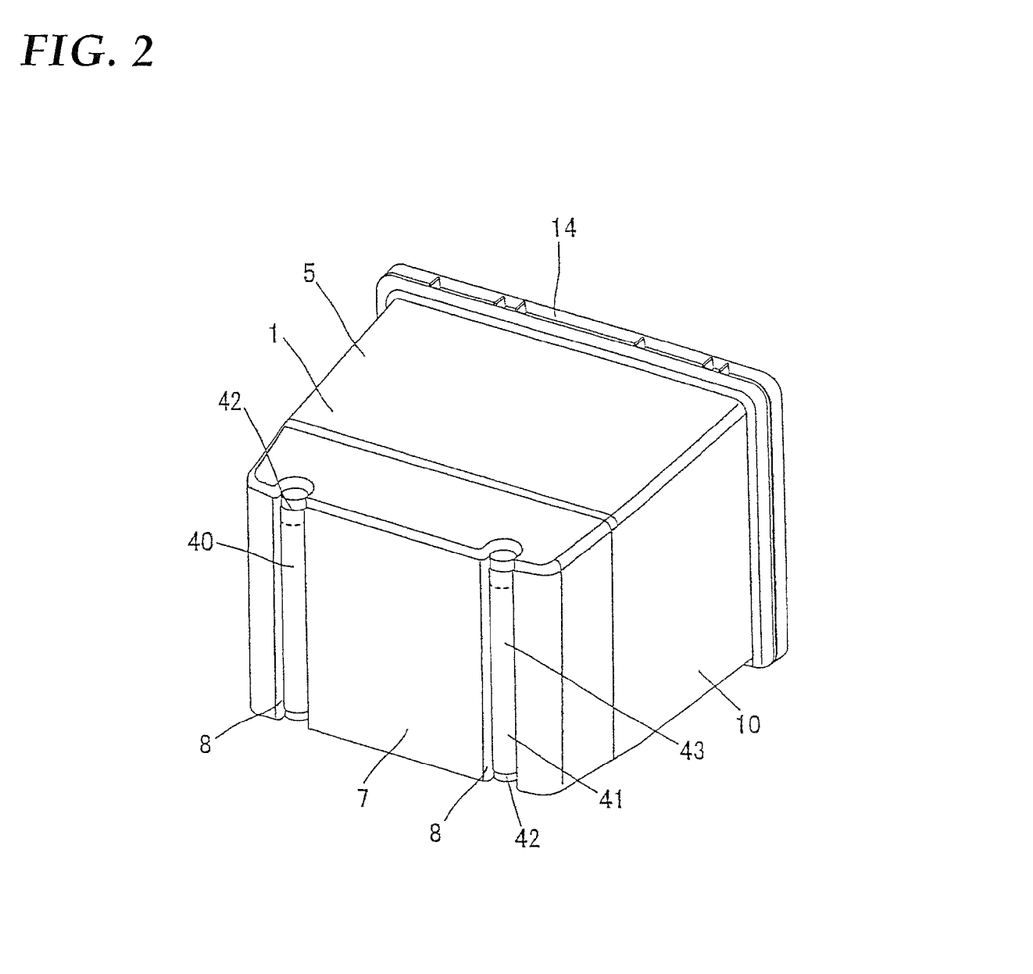
FIG. 2 is an illustrative perspective view schematically showing a rear wall side of a container body in the embodiment of the substrate storage container according to the present invention.
Figure 3:
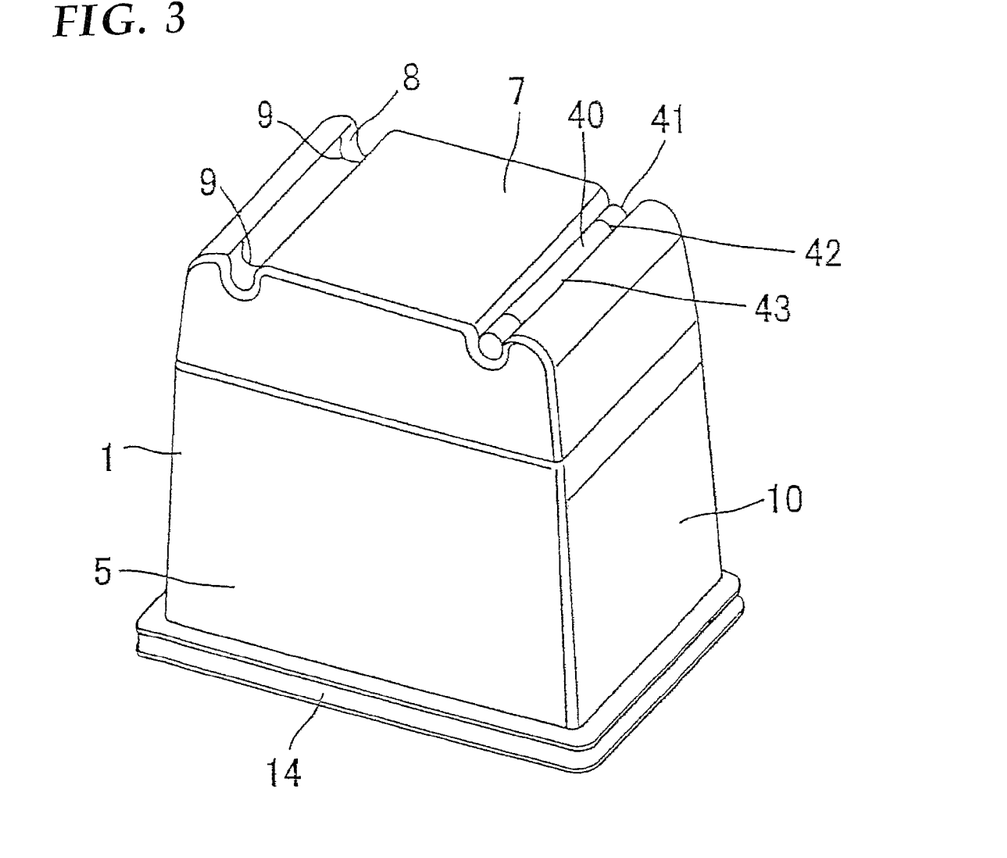
FIG. 3 is an illustrative perspective view schematically showing recessed portions and capsules of the container body in the embodiment of the substrate storage container according to the present invention.
Figure 4:
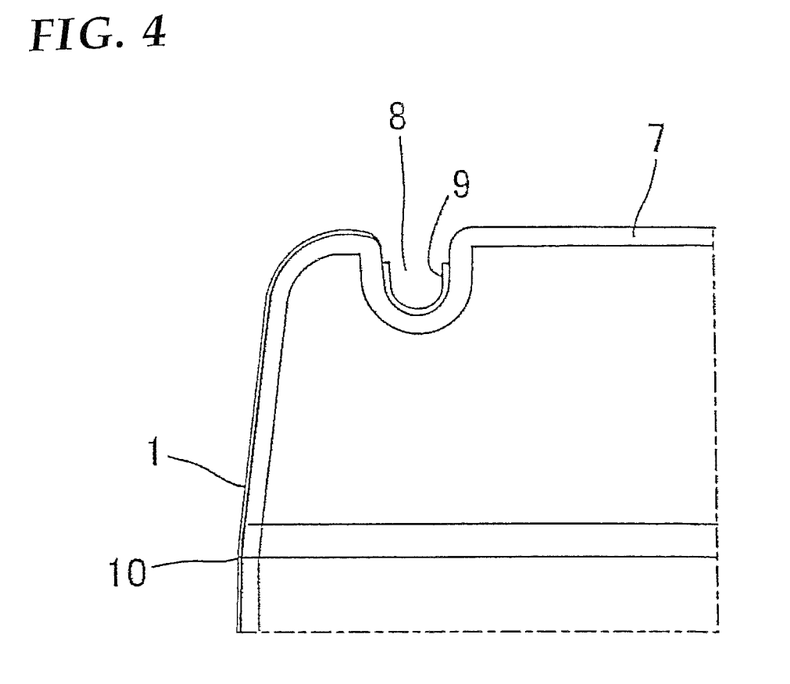
FIG. 4 is a partial illustrative view schematically showing the recessed portion of the container body in the embodiment of the substrate storage container according to the present invention.
Figure 5:
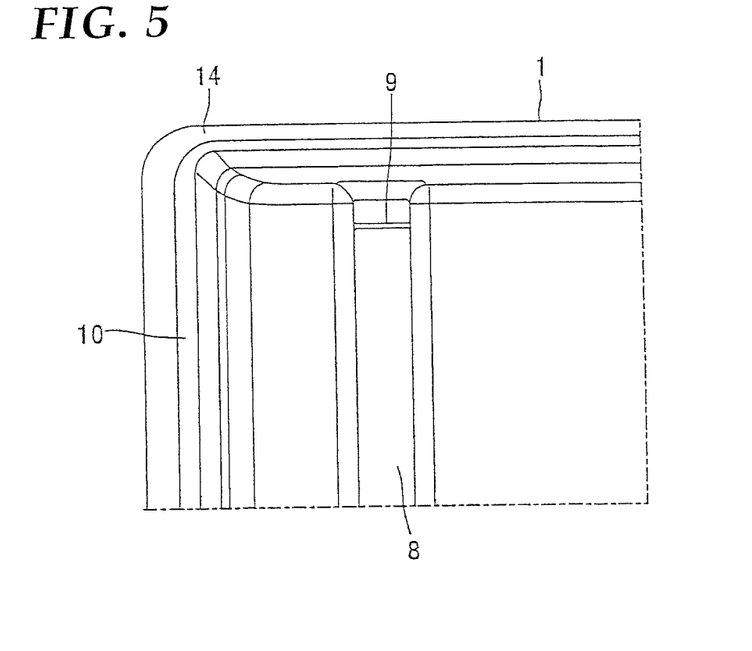
FIG. 5 is a partial rear illustrative view schematically showing the recessed portion of the container body in the embodiment of the substrate storage container according to the present invention.

As shown in FIG. 1 to FIG. 3, the container body 1 is formed into a front open box having a front 13 opened which stores the semiconductor wafer W horizontally, and the front 13 which is horizontally long in the state of being faced in a horizontal direction is positioned and loaded on a load port device attached to a processing apparatus, or cleaned with cleaning liquid in a cleaning tank. On both sides inside the container body 1, that is, on an inside of both side walls 10, a pair of left and right supporting teeth 2 supporting the semiconductor wafer W horizontally are provided to be opposed to each other, the pair of supporting teeth 2 are arranged vertically at a predetermined pitch, and each of the supporting teeth 2 is formed into an elongated piece extended in a front-back direction.

On front both sides and at a rear center of a base plate 3 of the container body 1, a plurality of positioning tools are respectively screwed through fastening screws or the like, and each positioning tool is formed into a substantially V-shape in section to be fitted to a positioning pin on a table of the load port device from above so as to function to position the substrate, storage container, namely, the container body 1 with high accuracy. Further, on the base plate 3 of the container body 1, a bottom plate 4 which covers the base plate 3 on which the plurality of positioning tools or the like are exposed is screwed through fastening screws horizontally, and on both left and right side portions of the bottom plate 4, conveyer rails for conveyance are selectively formed, respectively.

As shown in FIG. 1, on a substantially center portion of a ceiling 5 of the container body 1, a robotic flange 6 for conveyance is attached detachably, and the robotic flange 6 is gripped to be suspended by a ceiling conveyance mechanism in a plant, and subsequently, the substrate storage container is conveyed between steps at high speed.

As shown in FIG. 2 to FIG. 5, a rear wall 7 which is at the rear of the container body is configured to be, for example, an uneven reinforced structure, and on left and right both side portions thereof, recessed portions 8 extending straight in a vertical direction are formed so that each portion is recessed inward, in which each of the pair of the left and right recessed portions 8 is curved and formed into a groove shape in substantially semicircle in section. Inside each of top and bottom both end portions of each recessed portion 8, an interference rib 9 exposed to the outside is curved and formed in an approximately semicircular arc shape in plan view. Moreover, on in inner surface both side portions of the rear wall 7, rear retainers capable of holding rear periphery of the semiconductor wafer W are selectively formed to be opposed to respective recessed portions 8.

On an outer surface of the both side walls 10 of the container body 1, notches 11 for mounting extending in a front-back direction are formed, and a grip portion 12 is detachably attached to each notch 11. Each grip portion 12 is not only gripped to be operated in times of emergency of operation or the like, but also exerts a function of reinforcement or prevention of deformation of the container body 1.

On the front 13 positioned on an opposite side of the rear wall 7 of the container body 1, a rim flange which protrudes outward from the periphery is bulgingly formed, and the lid 20 is detachably pressed into the rim flange 14 to be fitted by a lid opening and closing device of the load port device. On the top and bottom both side portions on an inner circumferential surface of the rim flange 14, locking holes 15 for a locking mechanism 30 of the lid 20 are respectively perforated.

The lid 20 is, as shown in FIG. 1, configured by including a horizontally long casing 21 which fits into the rim flange 14 on the front 13 of the container body 1, a surface plate 28 which covers an open front of the casing 21, and the locking mechanism 30 which is arranged between the casing 21 and the surface plate 28.

The casing 21 is basically formed into a shallow substantially dish shape in section with a frame-shaped peripheral wall, a center portion of which is protruded and formed into a substantially box shape in front view from a back side to a surface side, and setting space for the locking mechanism 30 is respectively separated to be formed between the center portion and the left and right both side portions of the peripheral wall. On top and bottom both side portions of the peripheral wall of the casing 21, through holes for the locking mechanism 30 are respectively perforated so that each of the through holes 22 are opposed to the locking holes 15 of the rim flange 14.

On an opposed surface, namely a back surface, which opposes to the semiconductor wafer W stored in the container body 1 of the casing 21, a front retainer 23 for resiliently holding the front periphery of the plurality of sheets of semiconductor wafers W is detachably attached. The front retainer 23 includes a vertically long frame body 24 which is attached to the back surface of the casing 21 to prevent deformation of the lid 20, and on a vertical crosspiece portion of the frame body 24, a plurality of elastic pieces 25 extending, as being inclined, toward a semiconductor wafer W direction are integrally formed respectively as being arranged vertically, and at a tip end portion of each elastic piece 25, a small holding block 26 is integrally formed for holding the front peripheral of the semiconductor wafer W by a V-groove.

On a back surface peripheral portion of the casing 21, a fitting groove in a frame shape is formed, and to the fitting groove, a lip-type gasket in press-contact with inner periphery of front 13 of the container body 1 is fitted tightly. The gasket is molded in an elastically deformable frame shape using as a molding material, for example, fluororubber, silicone rubber, various thermoplastic elastomer (for example, olefin-based, polyester-based, polystyrene-based, etc.) and the like which are excellent in, for example, heat resistance and weather resistance.

The surface plate 28 is formed into a horizontally long flat plate corresponding to the open front of the casing 21, in which on the left and right both side portions, operating ports 29 for the locking mechanism 30 are respectively perforated. Moreover, the locking mechanism 30 is configured by including a pair of left and right rotary plates 31 which are rotated and operated by an operation pin of the lid opening and closing device penetrating the operating ports 29 of the surface plate 28, a plurality of slide plates 32 which slide vertically along with rotation of each rotary plate 31, and a plurality of locking claws 33 which protrude from the through holes 22 of the casing 21 along with sliding of each slide plate 32 and fasten on the locking holes 15 of the rim flange 14, and placed in front of the front retainer 23.

As shown in FIG. 2 to FIG. 7, the gravity center position adjustment member 40 is composed of a pair of left and right heavy capsules 41 detachably fitted to the pair of left and right recessed portions 8 on the rear wall 7 of the container body 1 respectively and filled with a predetermined amount of an impact alleviating material 43 that is in balance with mass of the lid 20, so that a position of the center of gravity of the substrate storage container storing the semiconductor wafer W falls within an acceptable range which is within ±40 mm, preferably ±30 mm from a center position of the semiconductor wafer.

Figure 6:
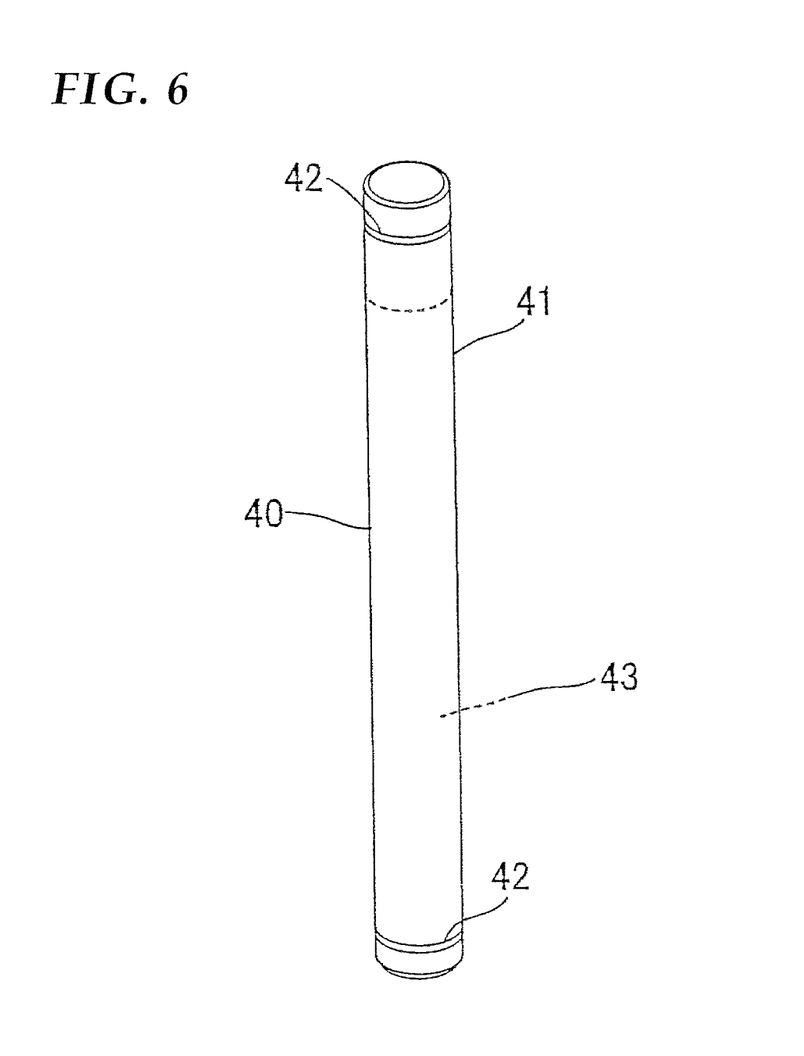
FIG. 6 is an illustrative perspective view schematically showing the capsule in the embodiment of the substrate storage container according to the present invention.
Figure 7:
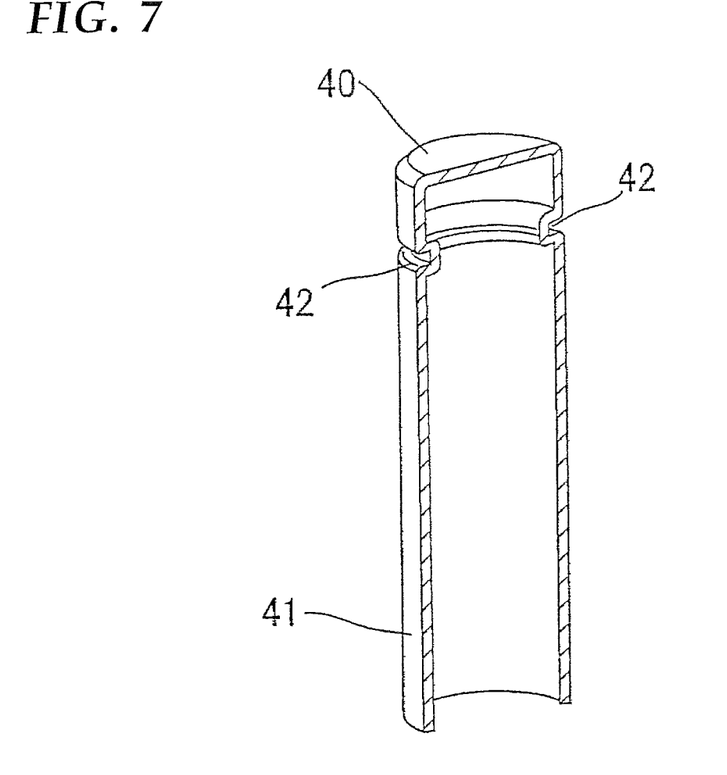
FIG. 7 is a partial sectional illustrative perspective view schematically showing the capsule in the embodiment of the substrate storage container according to the present invention.

Each capsule 41 is formed into a vertically long hollow cylindrical shape, namely, a cylindrical shape, having approximately the same length as the height of the rear wall 7 of the container body 1 by using a predetermined material, and on an outer circumferential surface on the top and bottom both end portions, interference grooves 42 in approximately ring shapes that press into and fit tightly in the interference ribs 9 of the recessed portions 8 are formed respectively, and tightly fitting by the interference grooves 42 prevents the capsule from coming off. As a predetermined material for the capsule 41, for example, a molding material similar to that of the container body 1 or the lid 20, which are various metal made of aluminum, stainless steel, copper and the like, an alloy thereof, a material in which a resin is coated on metal or an alloy thereof, or the like may be applicable.

When it is desired to facilitate changing of an injection or fill amount of the impact alleviating material 43, the capsule 41 is formed so as to be splittable vertically or horizontally. For example, a configuration is provided such as including a capsule body in a cylindrical shape with a bottom in which the impact alleviating material 43 is injected, and a detachable cap is screwed into an opened end portion of the capsule body.

Applicable impact alleviating material 43 is, for example, liquid, a gel-like member, a granular body, foam, and the like, which are not particularly limited, and functions as a damper by being operated vertically, etc. in response to a movement of the substrate storage container. In the case where the impact alleviating material 43 is liquid, water, oil with high viscosity resistance, polyacrylic acid absorbing water, polyvinyl alcohol, polyurethane, polyacrylamide, polynorbornene resin absorbing oil, polystyrene-butadiene copolymer resin, and the like are used as appropriate.

According to the configuration described above, the large size capsules 41 are fitted in the grooves 8 on the rear wall 7 of the container body 1 as counterweights to be balanced with the heavy lid 20, so that a position of the center of gravity of the substrate storage container storing the semiconductor wafer W is able to be suppressed to fall within an acceptable range which is within ±40 mm from the center position of the semiconductor wafer W.

With such a suppressive action, it is possible to remarkably suppress that the center of gravity of the substrate storage container storing the semiconductor wafer W is largely biased to the front 13 side, namely, the front lid 20 side, or to effectively prevent the substrate storage container from inclining toward the lid 20 side even when being held up and conveyed by the ceiling conveyance mechanism. Accordingly, in conveyance by the ceiling conveyance mechanism, it becomes really easy to convey at high speed the substrate storage container while keeping a stable posture, or to position and load it to the load port device of the processing apparatus horizontally.

Further, since there is no need to form the lid 20 thinner so that reduction in weight is realized, it is possible to eliminate the possibility to cause deformation or damage of the lid 20 due to shortage of rigidity. In addition, the capsules 41 are not merely positioned on the rear wall 7 of the container body 1, but the capsules 41 having approximately the same lengths as that of the rear wall 7 of the container body 1 are respectively positioned on the both side portions on the rear wall 7, so that it is possible to substantially improve balance between front and back or left and right of the substrate storage container, and to effectively hinder rotation of the semiconductor wafer W or the like along with the deterioration of the balance.

Further, over the substantially entire area of the semiconductor wafer W stored horizontally in the container body 1, the capsules 41 which are the counterweights are arranged vertically with respect to the semiconductor wafer W, thus making it possible to uniformly adjust the position of the center of gravity of the substrate storage container also in a Z direction while maintaining good balance. Therefore, it becomes possible to make vibration of the substrate storage container associated with the biased position of the center of gravity smaller even at the time of conveyance of the substrate storage container at high speed.

Further, since in each capsule 41, a solid counterweight is not merely stored, but the fluid impact alleviating material 43 is filled, even when impact acts on the substrate storage container, it is possible to absorb, suppress vibration of or damp the impact by the flow of the impact alleviating material 43. Therefore, it is greatly expected to prevent damage of the substrate storage container or the semiconductor wafer W. Further, since each capsule 41 is in a columnar shape corresponding to design of the recessed portion 8 and is detachable, it is possible to accommodate various needs such that the capsule 41 is removed as necessary, the impact alleviating material 43 is increased or decreased as appropriate, and the like.

Figure 8:
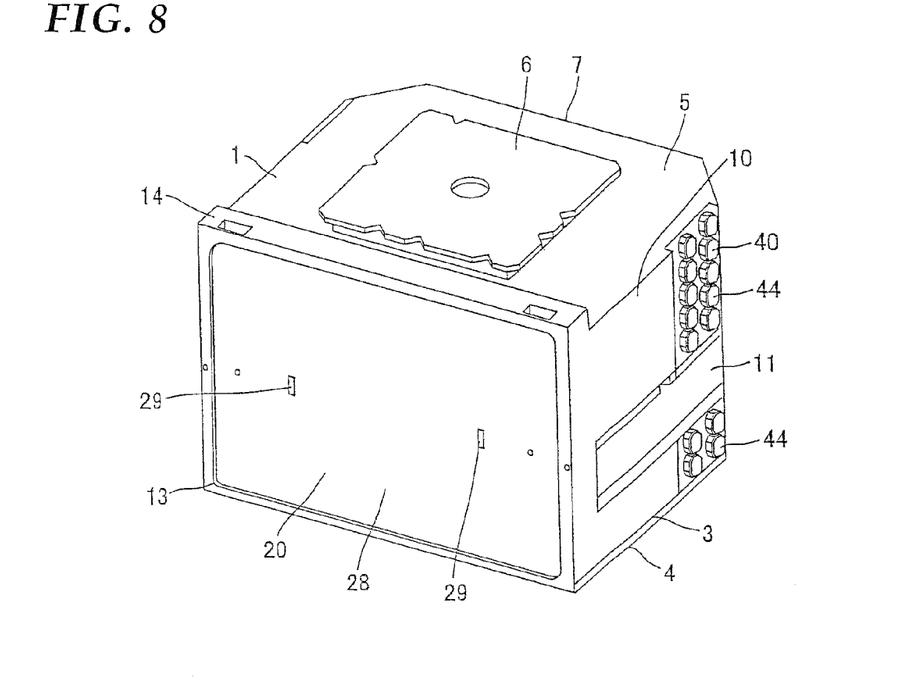
FIG. 8 is an illustrative perspective view schematically showing a second embodiment of the substrate storage container according to the present invention.

Next, FIG. 8 shows a second embodiment of the present invention, and in this case, it is configured that at rear portions on the both side walls 10 which are at the rear of the container body 1, a plurality of heavy reinforcement ribs 44 serving as the gravity center position adjustment member 40 are integrally aligned vertically, respectively, and each reinforcement rib 44 is formed into a substantially polygonal button shape.

A size, the number, and the like of the plurality of reinforcement ribs 44 are determined in view of mass of the lid 20, and as necessary, in which a member made of copper, aluminum, stainless steel, a member in which an alloy thereof is coated with a resin, and the like is inserted. Since the other parts are the same as those of the above embodiment, description thereof will be omitted.

It is clear that the same operation and effect as those of the above embodiment are able to be expected also in the present embodiment, and further, the configuration of the gravity center position adjustment member 40 is able to be diversified, and additionally, there is no necessity for purposely producing a separate capsule 41 as the gravity center position adjustment member 40. Moreover, since it is possible to omit operation for providing the recessed portion 8 on the rear wall 7 of the container body 1, there is no necessity to improve a mold for injection molding of the container body 1.

Figure 9:
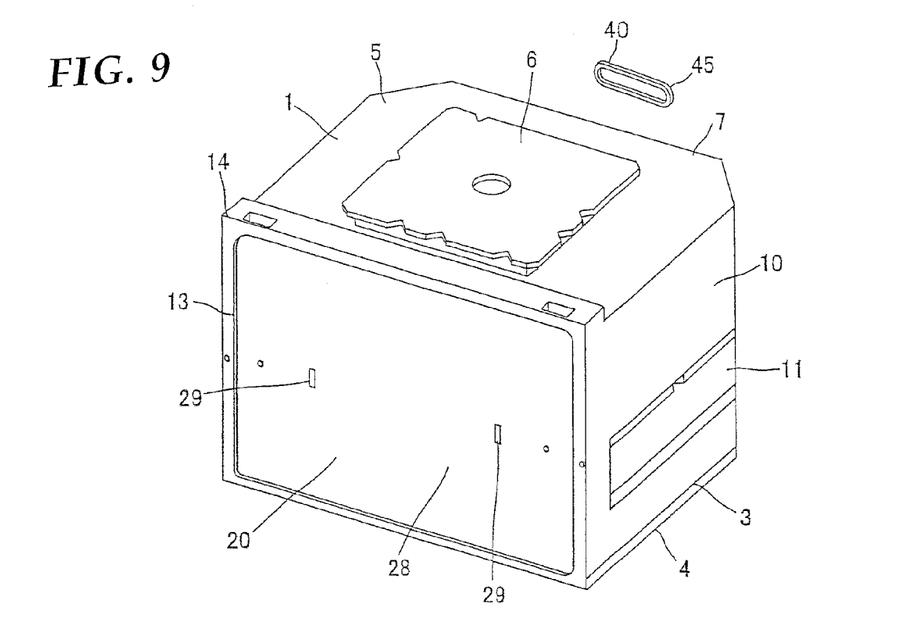
FIG. 9 is an illustrative perspective view schematically showing a third embodiment of the substrate storage container according to the present invention.
Figure 10:
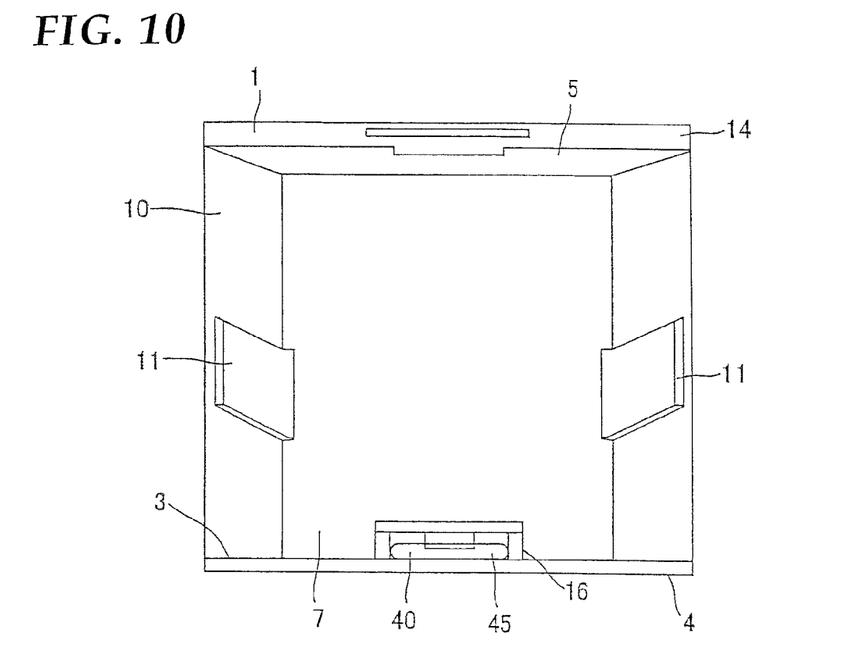
FIG. 10 is a rear illustrative view schematically showing the third embodiment of the substrate storage container according to the present invention.

Next, FIG. 9 and FIG. 10 show a third embodiment of the present invention, and in this case, a heavy counterweight 45 detachably attached between rear portions of the base plate 3 and the bottom plate 4 serves as the gravity center position adjustment member 40.

On a surface rear portion of the bottom plate 4, a mounting portion 16 for the counterweight 45 is formed. The counterweight 45 is composed of, for example, a plate, a bar made of copper or lead, and the like balanced with the mass of the lid 20, which is however not particularly limited, and as necessary, coated to be protected with a cover made of synthetic resin or the like and attached to the mounting portion 16 of the bottom plate 4. Since the other parts are the same as those of the above embodiment, description thereof will be omitted.

The same operation and effect as those of the above embodiment are able to be expected also in the present embodiment, and adding to that the configuration of the gravity center position adjustment member 40 is able to be diversified and a size thereof is able to be reduced, there is no necessity to be provided with the recessed portion 8 provided, it is thus not necessary to improve a dedicated mold for injection molding of the container body 1.

Figure 11:
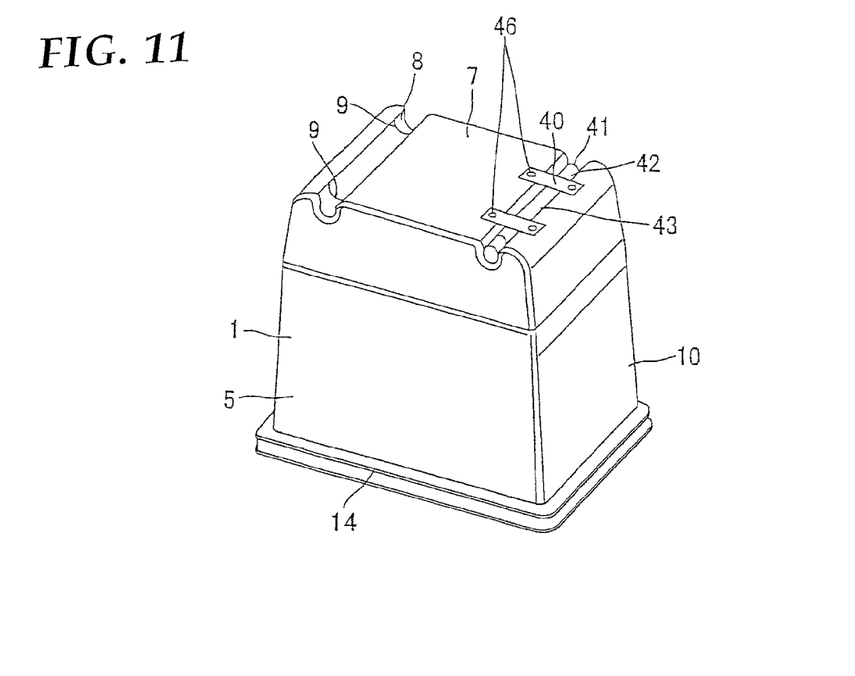
FIG. 11 is an illustrative perspective view schematically showing a fourth embodiment of the substrate storage container according to the present invention.
Figure 12:
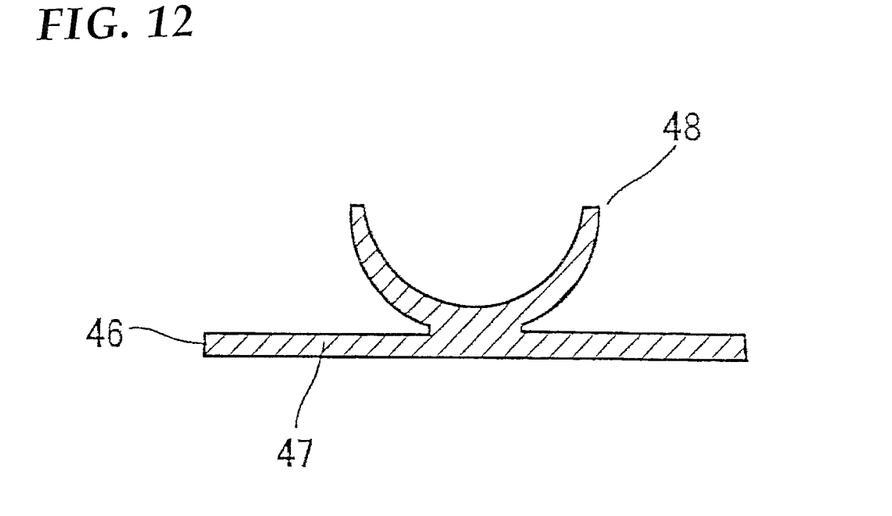
FIG. 12 is a sectional illustrative view schematically showing a stopper band in the fourth embodiment of the substrate storage container according to the present invention.

Next, FIG. 11 and FIG. 12 show a fourth embodiment of the present invention, and in this case, it is configured that a plurality of stopper bands 46 for fitting each capsule 41 to prevent coming off thereof are detachably screwed on the top and bottom on the rear wall 7 of the container body 1.

Each stopper band 46 includes a long and thin flexible band 47 that strides over the recessed portion 8 on the rear wall 7, and on an inner surface of the band 47, a curved elastic holding piece 48 in an approximately semicircular arc shape in section for closely contacting with and holding an outer circumferential surface of the capsule 41 is integrally formed. Since the other parts are the same as those of the above embodiment, description thereof will be omitted.

The same operation and effect as those of the above embodiment are able to be expected also in the present embodiment, and further, it is possible to prevent coming off of the capsule 41 in the simple configuration.

Figure 13:
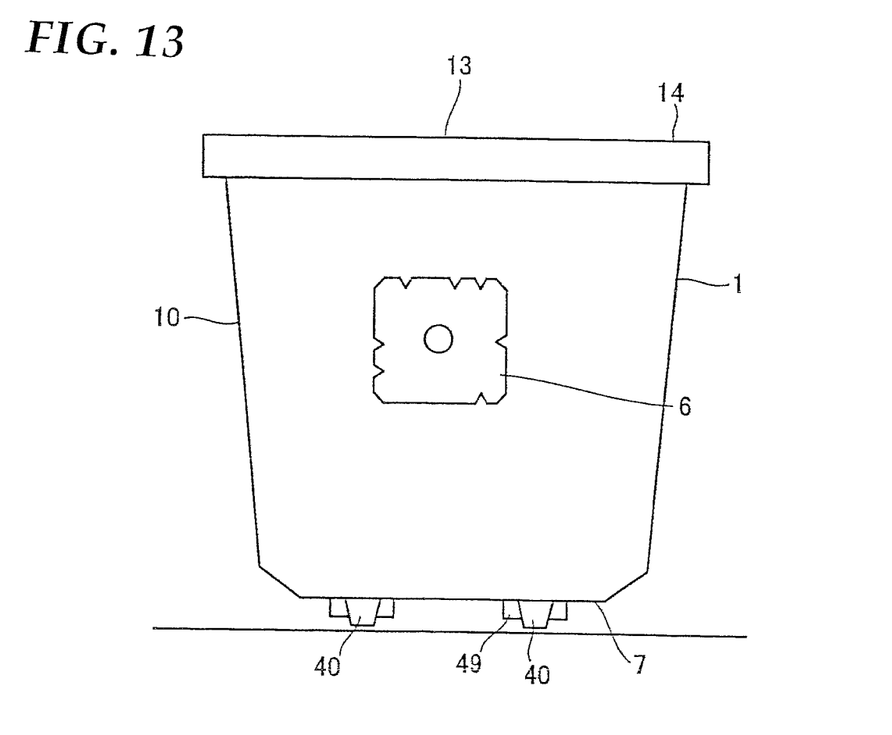
FIG. 13 is an illustrative view schematically showing a fifth embodiment of the substrate storage container according to the present invention.

Next, FIG. 13 shows a fifth embodiment of the present invention, and in this case, it is configured that on the top and bottom on the rear wall 7 of the container body 1, a plurality of heavy supporting blocks 49 serving as the gravity center position adjustment member 40 are attached with a predetermined interval therebetween to form the plurality of supporting blocks 49 having same heights, and by the plurality of supporting blocks 49, a posture of the container body 1 is controlled.

The required number such as 2, 4, 5 or 6 pieces of the plurality of supporting blocks 49 are used and screwed on the rear wall 7 of the container body 1 with a predetermined interval therebetween by a fastening tool or the like vertically or vertically and laterally. For example, the plurality of supporting blocks 49 are screwed in four corner portions or four corner portions and a center portion of the rear wall 7 of the container body 1 as appropriate. Each supporting block 49 is formed into a square shape, a polygonal shape, a round shape or the like having heavy weight and same height as that of the other supporting block 49 using a predetermined material made of aluminum, stainless steel, copper, synthetic resin and the like. Since the other parts are the same as those of the above embodiment, description thereof will be omitted.

The same operation and effect as those of the above embodiment are able to be expected also in the present embodiment, and additionally, the heights of the plurality of heavy supporting blocks 49 are aligned so that it is possible to stabilize the posture of the container body 1 to prevent inclination when the container body 1 is arranged on a predetermined table so that the front 13 faces upward. Therefore, it is clear that it is possible to prevent adjacent semiconductor wafers W from inclining randomly to be in contact with each other, which may cause damage or breakage along with the contact. Furthermore, since there is no need to provide the recessed portion 8 on the rear wall 7 of the container body 1, there is no necessity to improve a mold for injection molding of the container body 1.

Figure 14:
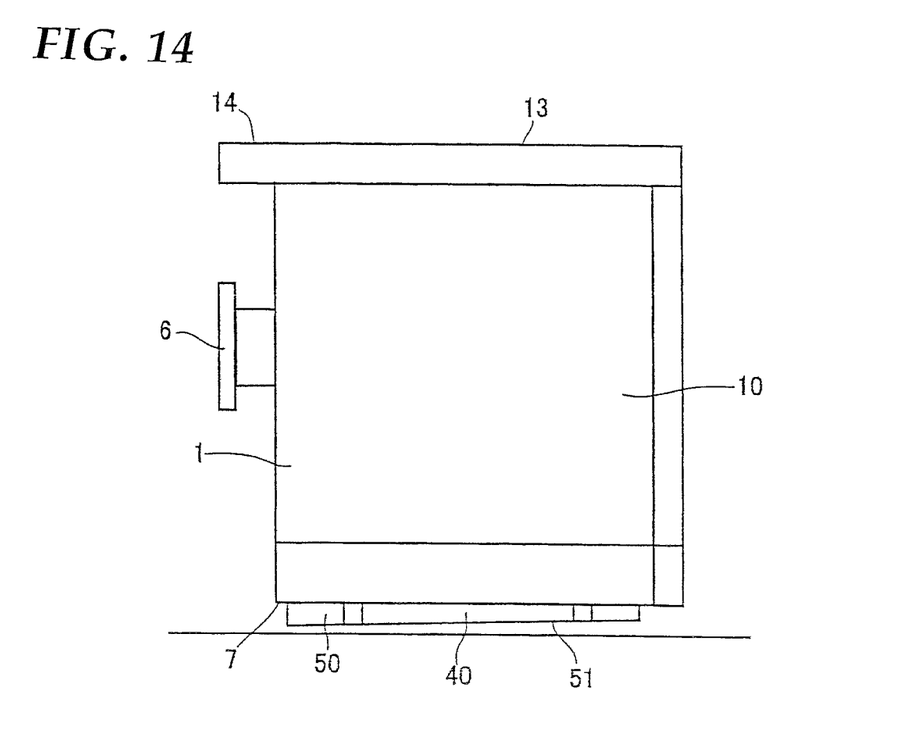
FIG. 14 is an illustrative view schematically showing a sixth embodiment of the substrate storage container according to the present invention.

Next, FIG. 14 shows a sixth embodiment of the present invention, and in this case, it is configured that a heavy supporting plate 50 serving as the gravity center position adjustment member 40 is attached on the rear wall 7 of the container body 1, and when the container body 1 is arranged so that the front 13 faces upward with the supporting plate 50, the posture of the container body 1 is adjusted to be slightly inclined to one direction.

The supporting plate 50 is formed into a smaller plate than the rear wall 7 of the container body using a predetermined material made of aluminum, stainless steel, copper, synthetic resin and the like, and is overlapped and screwed on the rear wall 7 of the container body 1 by a fastening tool or the like. The supporting plate 50 is formed such that a contact surface which is in contact over the rear wall 7 of the container body 1 becomes flat, and a large non-contact surface 51 which is not in contact over the rear wall 7 is formed to be slightly inclined, thereby making a thickness on a ceiling 5 side of the container body 1 thicker, and a thickness on a base plate 3 side of the container body 1 thinner. Since the other parts are the same as those of the above embodiment, description thereof will be omitted.

The same operation and effect as those of the above embodiment are able to be expected also in the present embodiment, and additionally, it is clear that when the container body 1 is arranged on a predetermined table such that the front 13 of the container body 1 faces upward while bringing the inclined non-contact surface 51 of the supporting plate 50 in contact therewith, and thereafter, even when the lid 20 is removed from the front 13 of the container body 1, a plurality of semiconductor wafers W are able to be aligned and supported by being inclined to one direction (for example, a back surface direction of the semiconductor wafer W).

Therefore, it is possible to prevent surfaces of the plurality of sheets of semiconductor wafers W from being in contact with each other, or adjacent semiconductor wafers W from being inclined in opposite directions and contacted to each other which may cause damage or breakage along with the contact. Furthermore, there is no need to provide the recessed portion 8 on the rear wall 7 of the container body 1, there is thus no necessity to improve a mold for injection molding of the container body 1.

Note that, in the above embodiment, the front retainer 23 is merely attached on the back surface of the casing 21 of the lid 20, however, the front retainer 23 may be attached on a back surface center portion of the casing 21, or the front retainer 23 may be attached on each of back surface both side portions of the casing 21. Furthermore, though a pair of capsules 41 are used in the above embodiment, one capsule may be used and three or four, etc. of the capsules may be used. Additionally, the capsules 41 may be fitted laterally, in an oblique direction or the like rather than being fitted vertically.

Further, on the rear wall 7 of the container body 1, a regulating piece, a tape or the like other than the stopper band 46 for regulating coming off of the capsule 41 fitted to the recessed portion 8 may be mounted as appropriate. Moreover, it is possible that an elastic layer such as vibration damping rubber or the like may be arranged between the recessed portion 8 and the capsule 41. Further, in the above embodiment, the capsule 41 is merely formed into a hollow columnar shape, however, may also be formed into a hollow elliptic columnar shape or rectangular columnar shape, or may be formed into a cylinder shape in a double structure in terms of prevention of leakage of the impact alleviating material. Furthermore, the gravity center position adjustment member 40 in the first, second, third, and fifth embodiments may be combined as appropriate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

INDUSTRIAL APPLICABILITY

The substrate storage container according to the present invention is used, for example, in a manufacturing field of semiconductors and liquid crystal.

EXPLANATIONS OF NUMERALS 1 container body
3 base plate
4 bottom plate
5 ceiling
6 robotic flange (suspended portion)
7 rear wall
8 recessed portion
9 interference rib
10 side wall
13 front
16 mounting portion
20 lid
21 casing
23 front retainer
28 surface plate
30 locking mechanism
40 gravity center position adjustment member
41 capsule
42 interference groove
43 impact alleviating material
44 reinforcement rib
45 counterweight
46 stopper band
47 band
48 elastic holding piece
49 supporting block
50 supporting plate
51 non-contact surface
W semiconductor wafer (substrate)

What is claimed is:

1. A substrate storage container comprising:
   a container body for storing a substrate of approximately 450 mm in diameter, the container body being formed into a front open box having an open front;
   a bottom plate attached to a base plate of the container body; and
   a lid for opening and closing the open front of the container body, in which the container body is provided with a suspended portion to be held by a conveyance mechanism for conveyance of the container,
   wherein a gravity center position adjustment member is provided at a rear portion of the container body so as to prevent the container body from inclining toward the lid and to maintain a position of the center of gravity of the substrate storage container storing the substrate within a range of 40 mm from a center position of the substrate, and
   wherein the gravity center position adjustment member is a counterweight that is attached between a rear portion of the base plate and a rear portion of the bottom plate.

2. The substrate storage container according to claim 1, wherein the gravity center position adjustment member is a hollow capsule, and
   wherein an impact alleviating material is filled and movable in the hollow capsule.

3. The substrate storage container according to claim 1, wherein on both sides of a rear wall of the container body, recessed portions are respectively formed, on an inner surface of each recessed portion, an interference rib is formed, a capsule is formed into a hollow substantially columnar shape so as to be able to be fitted to each of the plurality of recessed portions on the container body, and on an outer circumferential surface of the capsule, an interference groove to which the interference rib of the recessed portion is fitted is formed.

4. The substrate storage container according to claim 1, wherein the gravity center position adjustment member further comprises a reinforcement rib that is formed on a side wall rear portion of the container body.

5. The substrate storage container according to claim 1, wherein the gravity center position adjustment member further comprises a plurality of supporting blocks mounted on a rear wall of the container body.

6. The substrate storage container according to claim 1, wherein the gravity center position adjustment member further comprises a supporting plate attached to a rear wall of the container body, and a part of a surface of the rear wall of the container body is inclined to the remaining part of the surface of the rear wall of the container body, and when the container body is arranged so that the front faces upward with the supporting plate, the container body is inclined toward one direction.

* * * * *